(12) United States Patent
Van Engelen et al.

(10) Patent No.: US 7,142,057 B2
(45) Date of Patent: *Nov. 28, 2006

(54) SYSTEM TO ACCELERATE SETTLING OF AN AMPLIFIER

(75) Inventors: Josephus A. E. P. Van Engelen, Aliso Viejo, CA (US); Kwang Young Kim, Irvine, CA (US); Mark Jonathan Chambers, Mission Viejo, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/182,972

(22) Filed: Jul. 18, 2005

(65) Prior Publication Data

US 2005/0248406 A1    Nov. 10, 2005

Related U.S. Application Data

(63) Continuation of application No. 10/653,348, filed on Sep. 3, 2003, now Pat. No. 6,963,245.

(51) Int. Cl.
*H03F 3/45* (2006.01)
(52) U.S. Cl. ................................ 330/259; 330/253
(58) Field of Classification Search ............... 330/259, 330/253, 257, 258, 261
See application file for complete search history.

(56) References Cited

U.S. PATENT DOCUMENTS

| | | | |
|---|---|---|---|
| 5,146,179 A * | 9/1992 | Carley et al. ............... | 330/253 |
| 5,838,199 A | 11/1998 | Nakamura | |
| 5,838,200 A * | 11/1998 | Opris ......................... | 330/258 |
| 5,936,466 A | 8/1999 | Andoh et al. | |
| 6,265,941 B1 | 7/2001 | Lopata | |
| 7,053,712 B1 * | 5/2006 | Bonaccio et al. ........... | 330/258 |
| 2005/0046481 A1 | 3/2005 | van Engelen et al. | |

OTHER PUBLICATIONS

1394, Agere Systems Inc., from http://www.agere/cpm/entnet/1394. html, 2 pages, printed Mar. 17, 2006 (Copyright 2002-2006).
1394, Philips, from http://www.semiconductors.philips.com/products/connectivity/1394/index.html, 2 pages, printed Mar. 17, 2006 (Copyright 2004-2005).
1394, *Integrated Devices Product Home from Texas Instruments*, Texas Instruments Inc., from http://focus.ti.com/paramsearch/docs/parametricsearch.tsp?family=analog&family-ID=547 &uiTemplateld=NODE__STRY__PGE__T&paramCriteria=no, 2 pages, printed Mar. 17, 2006 (Copyright 1995-2005).

(Continued)

*Primary Examiner*—Henry Choe
(74) *Attorney, Agent, or Firm*—Sterne, Kessler, Goldstein & Fox P.L.L.C.

(57) ABSTRACT

A system and method are used to accelerate settling or steady state of an amplifier in an amplifier system. This is used to ensure the amplifier reaches steady-state within a specified time period from stand-by or another state without using more current than is needed for steady-state. A comparator in a common-mode feedback system compares a desired amplifier output signal to one or more nodes of the amplifier. A result of the comparison is compared to a threshold value using a comparator in a settling acceleration system. If the result crosses the threshold, a controller turns on a driver in the settling acceleration system. The driver pulls on one or more nodes of the amplifier, which, along with a driver in the amplifier system pulling on the node, quickly brings the amplifier to settling or steady state.

20 Claims, 5 Drawing Sheets

OTHER PUBLICATIONS

*FW803 PHY IEEE * 1394A Three-Cable Transceiver/Arbiter Device*, Data Sheet, Rev. 3, Agere Systems Inc., 24 pages (Jun. 2001).

*PDI1394P21 3-port 400 Mbps physical layer interface*, Data Sheet, Philips, 40 pages (Sep. 6, 2001).

*PDI1394P23 2-port/1-port 400 Mbps physical layer interface*, Data Sheet, Philips, 42 pages (Sep. 6, 2001).

*TSB41AB3 IEEE 1394a-2000 Three-Port Cable Transceiver/Arbiter*, Texas Instruments Inc., 50 pages (Copyright 2001).

*TSB81BA3 IEEE 1394b Three-Port Cable Transceiver/Arbiter*, Texas Instruments Inc., 57 pages (Copyright 2002).

* cited by examiner

SYSTEM TO ACCELERATE SETTLING OF AN AMPLIFIER

CROSS REFERENCE TO RELATED APPLICATIONS

This application is a continuation of U.S. application Ser. No. 10/653,348, filed Sep. 3, 2003 now U.S. Pat. No. 6,963,245, which is incorporated by reference in its entirety.

BACKGROUND OF THE INVENTION

1. Field of the Invention

The present invention is related to systems and methods to bring amplifier systems to steady state.

2. Background Art

Low power electronic circuits usually have a complex set of power-down modes to save as much power as possible. However, these circuits often also have a specific response time requirement to power-up requests. Therefore, the circuits need to be able to wake-up relatively quickly. The power-up time for the circuits is determined by the capacitance on each node of the circuit and the amount of current available to charge that capacitance to the desired steady-state voltage. In amplifiers or operational transconductance amplifiers (OTAs) with differential inputs and differential outputs, the circuits need to settle to an operating point both differentially and common-mode. Often, such differential input/output amplifiers have a common-mode control circuit that sets the common-mode voltage levels in the circuit to desired levels.

Often, powering up of these circuits within the specified time takes more power (current) than is needed for steady state operation, resulting in conflicting design requirements. This is because if a designer limits a current for a low power circuit, the designer is also limiting the minimum power-up time. For example, circuits are designed to handle the power-up requirements, which results in wasted power during steady-state operation. Also, a first stage of a two-stage Miller-compensated amplifier must have very low current for stability of the circuit, which can lead to deteriorating of the power-up time.

Therefore, what is needed is a system and method that would allow an amplifier to remain stable and achieve power-up within a required time period, but that does not require more power than a steady-state operation of the amplifier.

BRIEF SUMMARY OF THE INVENTION

Embodiments of the present invention provide a method, including the following steps. Comparing one or more nodes of an amplifier to a common-mode reference to generate a result signal. Comparing the result signal to a threshold. Activating a driving system to drive the amplifier if the result signal crosses the threshold value, such that the amplifier achieves steady state in an accelerated time period.

Embodiments of the present invention provide a system including an amplifier portion, a common-mode feedback portion, and a settling acceleration portion. The settling acceleration portion includes a comparator, a controller, and a driving system. The comparator generates a first signal from comparing a second signal from the common-mode feedback portion to a threshold value. The controller activates the driving system when the second signal crosses the threshold value to drive the amplifier portion, such that the amplifier portion achieves steady state in an accelerated time period.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1:
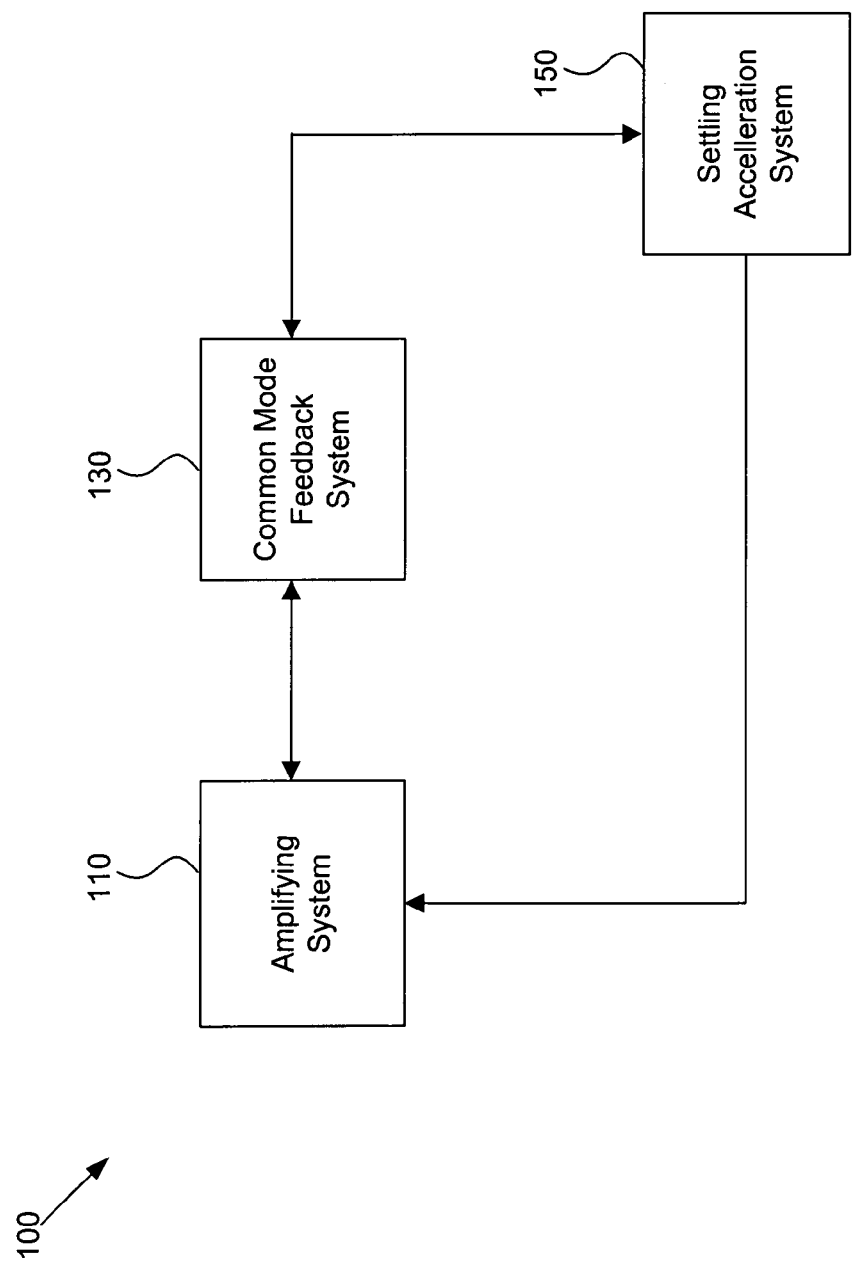
FIG. 1 shows a system including a settling acceleration system according to embodiments of the present invention.

The present invention will now be described with reference to the accompanying drawings. In the drawings, like reference numbers may indicate identical or functionally similar elements. Additionally, the left-most digit(s) of a reference number may identify the drawing in which the reference number first appears.

DETAILED DESCRIPTION OF THE INVENTION

Overview

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

Embodiments of the present invention provide a system and method of accelerating settling or steady state of an amplifier in an amplifier system. This is used to ensure the amplifier reaches steady state within a specified time period from stand-by or another state without having more current than is needed for steady-state operation. A comparator in a common-mode feedback system compares a desired amplifier output signal to one or more nodes of the amplifier. A result of the comparison is compared to a threshold value using a comparator in a settling acceleration system. If the result crosses the threshold, a controller turns on a driver in the settling acceleration system. The driver pulls on one or more nodes of the amplifier, which, along with a common-mode driver in the amplifier system pulling on the node, quickly brings the amplifier to settling or steady state.

Overall System Having an Amplifier Accelerated Settling System

Figure 2:
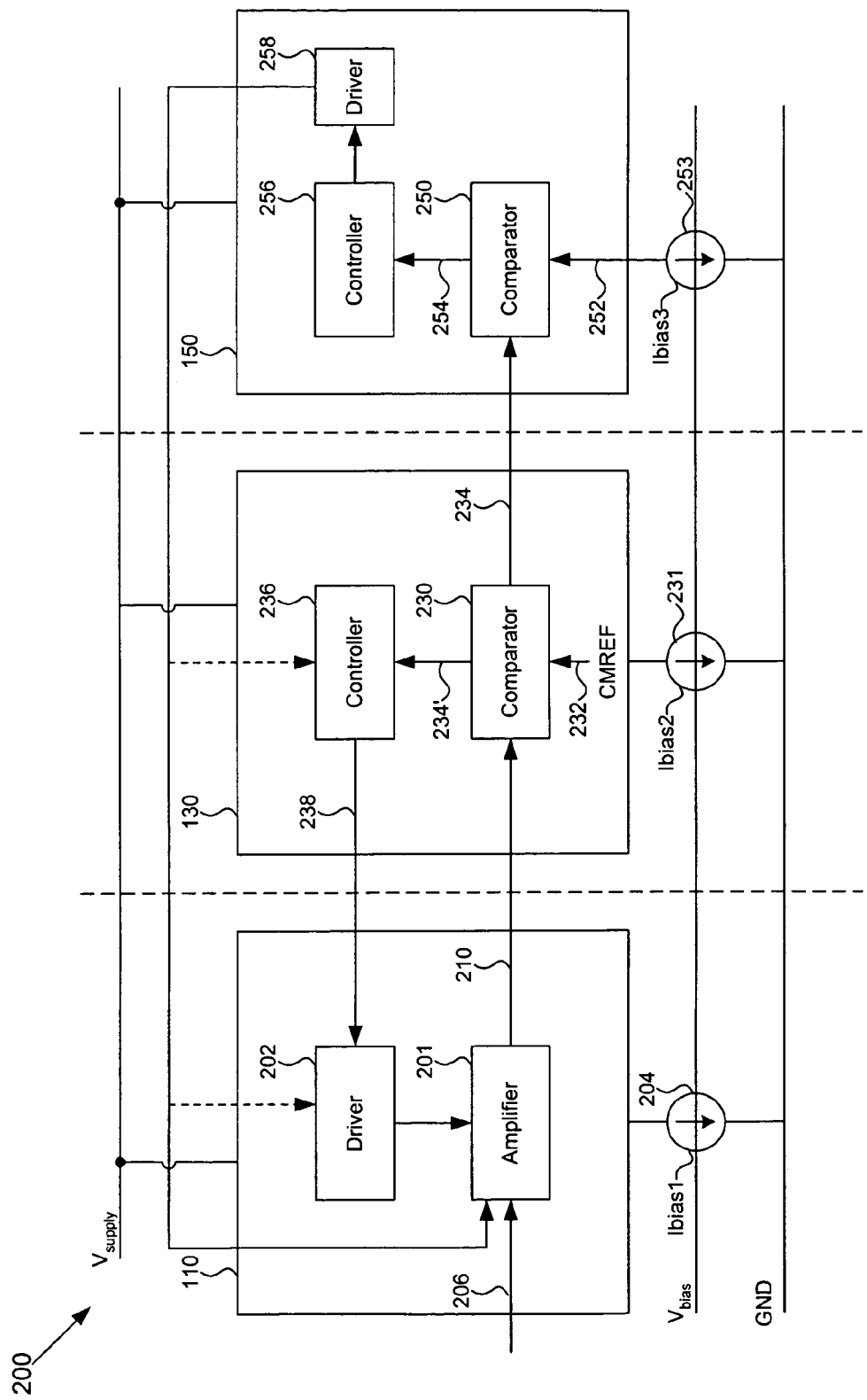
FIG. 2 shows a system including a settling acceleration system according to embodiments of the present invention.
Figure 3:
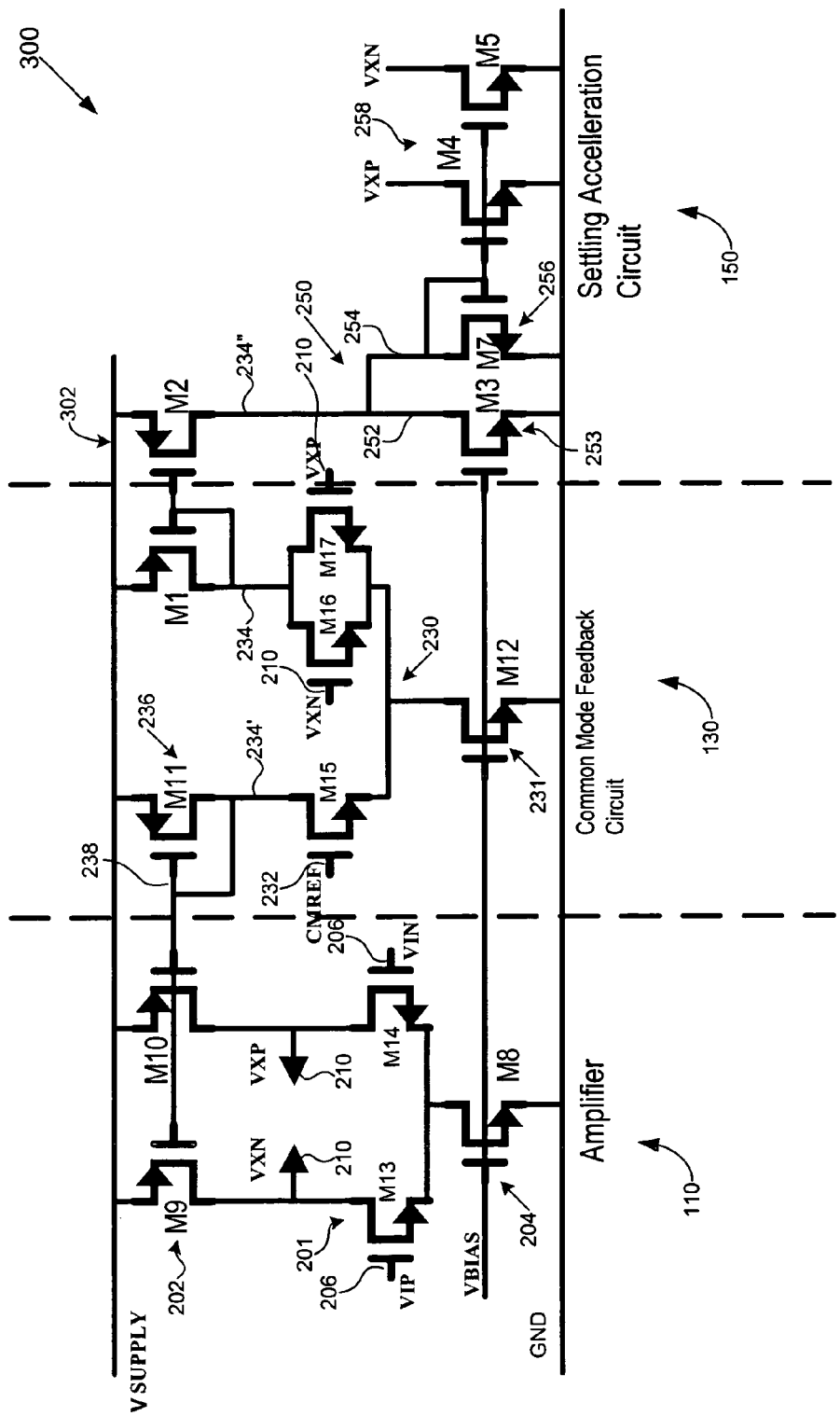
FIG. 3 is a schematic diagram of a circuit implementation of FIG. 2 including a single-stage amplifier and settling acceleration portion.
Figure 4:
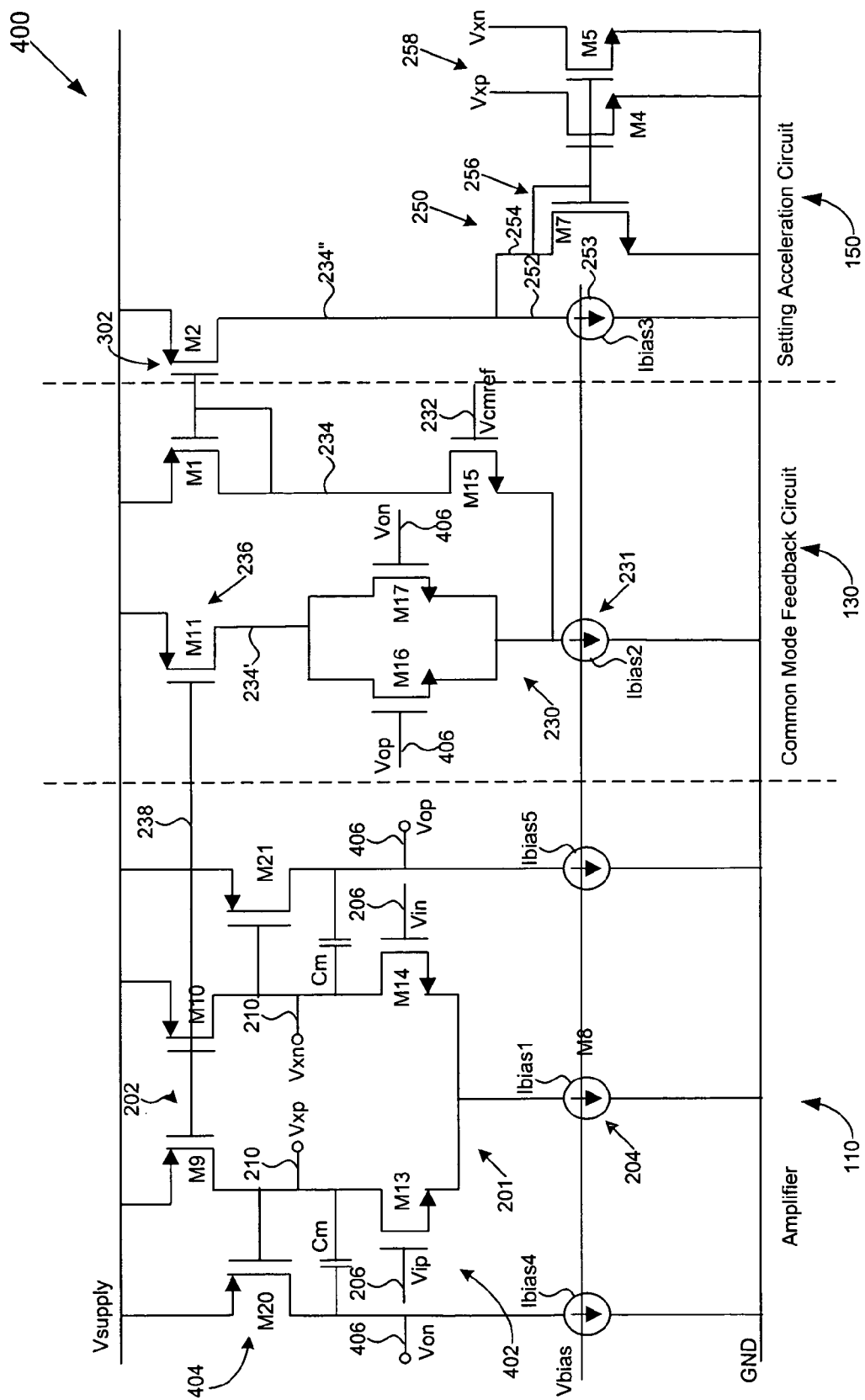
FIG. 4 is a schematic diagram of a circuit including a two-stage Miller-compensated amplifier and a settling acceleration portion according to embodiments of the present invention.

FIG. 1 shows a system 100 according to embodiments of the present invention. System 100 includes an amplifier system 110, a common mode feedback system 130, and a settling acceleration system 150. As best seen in FIGS. 2–4, these systems can be powered via Vsupply and Gnd and biased using Vbias.

System and Circuit Having a Single Stage Amplifier and an Accelerated Setting System FIGS. 2–3 show a system 200 and a schematic diagram of a circuit implementation 300 of system 200 according to embodiments of the present invention. System 200 and circuit 300 include a single-stage amplifier system 110 and settling acceleration system 150. Amplifier system 110 includes an amplifier 201 and a driver 202. Amplifier 201 is biased via current source Ibias1 204 and receives an input 206, which can be from inside or outside system 100. Input 206 can be used to initiate amplifier 201 transitioning from a power-down state (e.g., stand-by) to steady state, or for other uses known in the relevant arts.

An output signal Vao 210 from amplifier 201 is received at comparator 230 in common-mode feedback portion 130, which is biased using Ibias2 231. Vao 210 is compared to a reference value CMREF 232, which can be a desired value for an amplifier portion output. Comparison result signals Cr1 234 and 234' are generated. Signal Cr1 234' is received at controller 236 in common-mode feedback portion 130 and signal Cr1 234 is received at comparator 250 in settling acceleration system 150. Although based on the same comparison, result signals Cr1 234 and Cr1 234' can be variations of each other. Cr1 234 is compared to a threshold value TH 252 (e.g., a bias current from bias current source Ibias3 253) to produce a comparison result signal Cr2 254. Comparison signal Cr2 254 is received at controller 256 and used to control driver 258.

In a first state (e.g., stand-by of amplifier 201 ), Vbias is low, Vao 210 is high (e.g., pulled to Vsupply level) and not near CMREF 232 In addition, controllers 236 and 256 and drivers 202 and 258 are inactive.

In a second state (e.g., power-up of amplifier 201), Vbias transitions to high, causing Vao 210 to begin decreasing towards CMREF 232, which takes a certain amount of time. This time period is usually set based on specifications for system 200. When this second state begins, Vao 210 is still greater than CMREF 232, so controller 236 and driver 202 are still inactive. As Vao 210 continues to decrease towards CMREF 232, controller 236 and driver 202 become active, pulling-up on Vao 210 or a node thereof.

A force or speed in which Vao 210 or a node thereof can be pulled down is relatively slow compared to a force or speed Vao 210 or a node thereof can be pulled up. Pulling down is determined based on a current from current source Ibias1 204 that sets a normal operating current of amplifier 201, which is fixed. When trying to limit peak power of amplifier system 110 to steady state operating power, a time to settling or steady state of Vao 210 may not conform to required specified time frames. Therefore, settling acceleration portion 150 is used to speed-up transitioning of amplifier 201 to steady state through additional current used to pull down on Vao 210. This is done without requiring amplifier system 110 to have more power than necessary for steady-state (e.g., when Vao 210 equalizes with CMREF 232), as is discussed in detail below.

Thus, when Vao 210 is still far above CMREF 232 and before controller 236 and driver 202 activate, Cr1 234 is greater than TH 252, which activates controller 256 using Cr2 254. When controller 256 is active, driver 258 is used to pull-down on Vao 210 (assisting Ibias1 204), which causes amplifier 201 to quickly settle or achieve steady-state (e.g., when Vao 210 equalizes with CMREF 232). When Voa 210 gets near CMREF 232, Cr1 234 becomes lower then TH 252 and driver 258 is turned off by controller 256. The final settling of Voa 210 is achieved by Ibias1 204 pulling down and/or driver 202 pulling up.

It is to be appreciated that driver 258 can also be coupled to driver 202 and/or controller 236 to assist them in their operation during the second state.

In a third state, steady state operation is achieved when an output from driver 202 matches Ibias1 204 and controller 256 and driver 258 are off. Therefore, amplifier 201 can be settled or brought to steady-state within specified time periods through use of driver 202 and driver 258, while avoiding using power beyond what amplifier 201 needs for steady-state. This allows amplifier system 110 to have more efficient power consumption during steady state than conventional systems.

The use of comparators 230 and 250 allows for a monitoring and detection of a state of amplifier 201. Through this monitoring or detection, any time amplifier 201 deviates too far from steady-state operation (e.g., when Voa 210 equals to CMREF 232), controller 256 activates driver 258, which quickly supplies the additional power necessary to settle amplifier 201 back into steady state. Thus, an automatic compensation operation can be implemented using system 100.

Therefore, there can be at least three states of systems 200 and 300. During a first state (e.g., an amplifier power-down situation), amplifier system 110 is off, and common-mode feedback system 130 and settling acceleration system 150 may be powered off as well. For example, Vbias is low and Voa1 210 is not near CMREF 232. During a second state (e.g., an amplifier power-up situation), amplifier system 110, common-mode feedback system 130, settling acceleration system 150 are on and Vbias is not low, but Vao1 210 is not near CMREF 232 and controllers 236 and 256 and driver 258 are active. During a third state (e.g., an amplifier is powered up and in steady-state operating condition), Voa1 210 is equal to CMREF 232 and controller 236 is active to keep Vao1 210 equal to CMREF 232. At the same time, controller 256 and driver 258 are no longer active because Cr1 234 is below TH 252.

As discussed above, FIG. 3 is a schematic circuit diagram 300 of system 200. Circuit 300 includes a single-stage amplifier 201 (M13 and M14) (where M refers to a transistor, a field effect transistor, or the like). Although shown as MOSFETS (e.g., PMOS and NMOS devices), other electronic devices could also be used, as would be apparent to a skilled artisan reading the instant specification. All variations for electronics are contemplated within the scope of the present invention.

Amplifier system 110 is biased using Ibias1 204 (M8) and includes an amplifier 201 (M13 and M14) having differential input signals 206 (VIP/VIN) and differential output signals 210 (VXN/VXP). Also, amplifier system 110 includes driver 202 (M9/M10).

Common-mode feedback system 130 includes comparator 230 (M15/M16/M17) and controller 236 (M11). Comparator 230 compares CMREF 232 (a voltage at a gate of M15) to an average of output signals Vao 210 to produce signals Cr1 234, 234', and 234". Cr1 234 is copied (amplified, inverted, etc.) from transistor M1 in common-mode feedback system 130 to transistor M2 in settling acceleration system 150 using a current mirror 302 (M1 and M2).

Once Cr1 234 is copied as Cr1 234", comparator 250 (M2/M3) in settling acceleration system 150 compares Cr1 234" (current from M2) to TH 252 (current from M3) to generate comparison result signal Cr2 254. Comparison result signal Cr2 254 is received at controller 256 (M7), which controls driver 258 (M4/M5).

Using NMOS devices for driver 258 allows for the pull-down of output VXN/VXP 210. Similarly, using PMOS devices for controller 236 and driver 202 allows for the pull-up of output VXN/VXP 210.

Operation of circuit 300 is similar to system 200 described above.

In the first state, Vbias is low, causing VXN/VXP 210 to go to Vsupply and not near CMREF 232.

In the second state, as Vbias becomes high VXP/VXN 210 are still well above CMREF 232, and M9/M10 and M11 are still turned off, while M8 pulls down on VXP/VXN 210. At this time current Cr1 234" is larger than current TH 254. When Cr1 234" is larger than TH 254, M7 turns on, causing M4/M5 to turn on. Once on, M4/M5 pull down on VXN/VXP 210, assisting M8, allowing M13/M14 to settle or come to steady state in an accelerated fashion.

In the third state, when VXN/VXP 210 come near CMREF 232, Cr1 234" drops below TH 252 and M7 no longer receives current, turning M4/M5 off. At the same time, M11 receives more current and controls M9/M10 to start pulling up on VXP/VXN 210. When M13/M14 reaches steady state, the pull up of M9/M10 matches the pull down of M8.

As discussed above, normally to speed up pull down time or force, current would have to be increased through M8. This, however, increases power consumption of amplifier system 110. Through use of M4/M5 pulling down on VXP/VXN 210, no increase in current is needed through M8, and M13/M14 settle very quickly at steady state.

The comparison of Cr1 234" and TH 254 in settling acceleration portion 150 is based on a width (W) to length (L) ratio of M1, M2, M3 and M12. Thus, comparator parameters can be adjusted by adjusting the W/L of M1, M2 M3, and/or M12. Thus, the threshold established by the W/L of M3, which has a fixed current there through, also establishes when M4 and M5 will turn on.

System Having a Two-Stage Amplifier and an Accelerated Settling System

FIG. 4 is a schematic diagram of a system 400 according to an embodiment of the present invention. System 400 can be an implementation of system 100 using a two-stage amplifier 402 (e.g. a two-stage Miller-compensated amplifier) including a first stage 201 (M13/M14) and a second stage 404 (M20/M21) (where M refers to a transistor, a field effect transistor, or the like). Second stage 404 (M20/M21) is bias using Ibias4 (M22) 403 and Ibias5 (M23) 405, respectively. Although shown as MOSFETS (e.g., PMOS and NMOS devices), other electronic devices could also be used, as would be known to a skilled artisan. All variations for electronics are contemplated within the scope of the present invention.

In addition to adding second stage 404 to amplifier system 110, a differential output voltage Vop/Von 406 from second stage 404 is used in comparator 230 instead of first stage 201 output voltage Vxn/Vxp 210 in circuit 300. Also, a large capacitance Cm is placed between first stage 201 and second stage 404 and the current in first stage 201 is reduced to make two-stage amplifier 402 stable. Common-mode feedback system 130 has some elements in opposite positions, compared to circuit 300. This can be because the polarity of Vop/Von 406 is opposite to the polarity of Vxp/Vxn 210 (e.g., voltages Vop/Von 406 go up together, while voltages Vxp/Vxn 210 went down together), so M15 receiving Vcmref 232 was repositioned.

It is to be appreciated that although shown as three elements 110, 130, and 150, they could be configured as one or two elements, with a larger system incorporating two or more of the smaller systems. Any configuration of systems 110, 130, and 150 is contemplated within the scope of the present invention.

In alternative embodiments, Ibias1 204, Ibias2 231, and Ibias3 253 could be positioned between Vsupply and systems 110, 130, and 150 instead of between Gnd and systems 110, 130 and 150. In these embodiments, Ibias1 204 would be pulling up on node Voa 210 and driver 202 (and driver 258) would be pulling down on node Vao 210. It is to be appreciated other alternative embodiments are also possible, as would become apparent to a skilled artisan from reading the instant application, and are contemplated within the scope of the present invention.

It is to be appreciated that many other configurations and types of amplifiers can incorporate the monitoring/settling acceleration system 150, which are all within the scope of the present invention.

For example, system 100 can include: cascode transistors could be placed in series with the current-source transistors; more elaborate current mirrors could be used; the settling acceleration circuit could be extended to a pull up-pull down configuration, or only a pull-up.

Also, variations to the amplifier system 110 can be that it includes: folded-cascode structures; a PMOS or combined NMOS/PMOS input differential pairs; implementation in a complete different technology such as bipolar or BiCMOS; multi-stage, with optional stability compensated; etc. Other specific amplifiers can be Ahuja Compensated two-stage differential input/output amplifiers.

Method of Accelerating Settling

Figure 5:
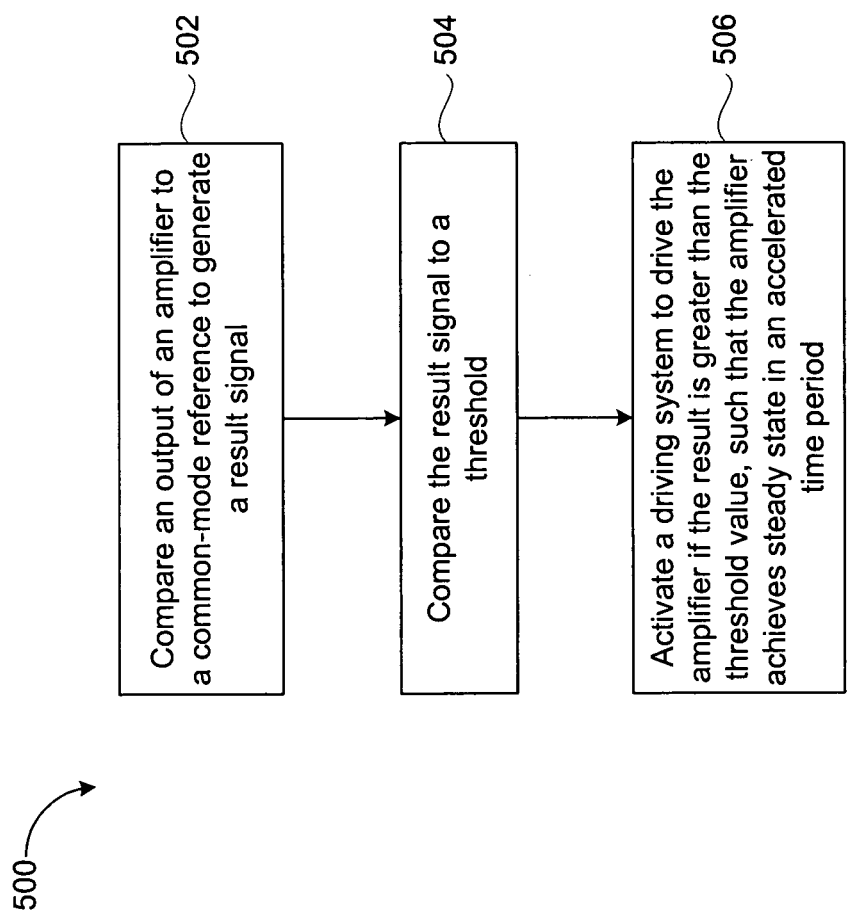
FIG. 5 is a flowchart showing a method according to an embodiment of the present invention.

FIG. 5 is a flowchart depicting a method 500 for accelerating settling or steady state of an amplifier according to embodiments of the present invention. One or more of the above systems 100, 300, and/or 400 can perform the method. In step 502, an output of an amplifier is compared to a common-mode reference to generate a result signal. In step 504, the result signal is compared to a threshold value. In step 506, a driving system is activated to drive the amplifier if the result signal is greater than the threshold value, such that the amplifier achieves steady state in an accelerated time period. The driving system can optionally also drive a common-mode feedback device that controls the amplifier to bring it to steady state.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention.

Thus, the breadth and scope of the present invention should not be limited by any of the above-described exemplary embodiments, but should be defined only in accordance with the following claims and their equivalents.

What is claimed is:

1. A system, comprising:
an amplifier;
a driving system;
means for comparing one or more nodes of the amplifier to a common-mode reference to generate a result signal;
means for comparing the result signal to a threshold; and
means for activating the driving system to drive the amplifier if the result signal crosses the threshold value, such that the amplifier achieves steady state in an accelerated time period.

2. The system of claim 1, further comprising:
means for driving a common-mode device with the driving system when the result signal crosses the threshold value.

3. The system of claim 1, further comprising:
means for modifying the result signal by at least one of copying, amplifying, and inverting the result signal, wherein the copied, amplified, or inverted result signal is used in the comparing step.

4. The system of claim 3, wherein the means for modifying comprises:
a current mirror that performs the copying of the result signal.

5. The system of claim 1, further comprising:
means for maintaining the driving system in an inactive state when the result signal crosses the threshold signal.

6. The system of claim 1, wherein the driving system pulls one or more nodes in the amplifier down.

7. The system of claim 1, wherein the amplifier comprises a single stage amplifier.

8. The system of claim 1, wherein the amplifier comprises a two-stage amplifier.

9. The system of claim 1, wherein the driving system pulls the one or more nodes of the amplifier up and down.

10. A system comprising:
an amplifier;
a common-mode feedback device; and
a settling acceleration device,
wherein the settling acceleration system drives the amplifier when a value of a signal from the common-mode feedback device crosses a threshold value, such that the amplifier achieves steady state in an accelerated time period.

11. The system of claim 10, wherein the amplifier comprises a single stage amplifier and a driver.

12. The system of claim 10, wherein the single stage amplifier and the driver each comprises a set of transistors.

13. The system of claim 12, wherein the sets of transistors comprise MOSFETS.

14. The system of claim 10, wherein the amplifier portion comprises a two-stage amplifier and a driver.

15. The system of claim 10, wherein the common-mode feedback device comprises:
a comparator that compares a signal output from the amplifier with a reference value to generate the common-mode feedback device signal; and
a controller that receives the common-mode feedback device signal and outputs a signal to the amplifier portion.

16. The system of claim 15, wherein the common-mode feedback device signal is transmitted from the controller to the settling acceleration device using a current mirror.

17. The system of claim 15, wherein the comparator and the controller in the common-mode feedback device comprise first and second sets of transistors, respectively.

18. The system of claim 17, wherein the first and second sets of transistors comprise MOSFETS.

19. The system of claim 15, wherein when in the first state the driving system drives the controller in the common-mode feedback device, which drives the amplifier, such that the amplifier achieves the steady state in the accelerated time period.

20. The system of claim 10, wherein the amplifier portion comprises a two stage Miller amplifier and a driver.

* * * * *